(12) United States Patent
Zhang et al.

(10) Patent No.: US 10,338,170 B2
(45) Date of Patent: Jul. 2, 2019

(54) PRE-AMPLIFIER FOR MAGNETIC RESONANCE IMAGING RADIO-FREQUENCY COIL

(71) Applicant: SHANGHAI CHENGUANG MEDICAL TECHNOLOGIES CO., LTD, Shanghai (CN)

(72) Inventors: Songtao Zhang, Shanghai (CN); Hao Wang, Shanghai (CN)

(73) Assignee: SHANGHAI KOITO AUTOMOTIVE LAMP CO., LTD, Shanghai (CN)

( * ) Notice: Subject to any disclaimer, the term of this patent is extended or adjusted under 35 U.S.C. 154(b) by 297 days.

(21) Appl. No.: 15/313,110

(22) PCT Filed: May 12, 2015

(86) PCT No.: PCT/CN2015/078726
§ 371 (c)(1),
(2) Date: Nov. 22, 2016

(87) PCT Pub. No.: WO2015/180564
PCT Pub. Date: Dec. 3, 2015

(65) Prior Publication Data
US 2017/0139020 A1     May 18, 2017

(30) Foreign Application Priority Data
May 27, 2014   (CN) .......................... 2014 1 0226536

(51) Int. Cl.
*G01R 33/36*     (2006.01)
*G01R 33/34*     (2006.01)
(Continued)

(52) U.S. Cl.
CPC ... *G01R 33/3614* (2013.01); *G01R 33/34092* (2013.01); *G01R 33/3621* (2013.01); *H03F 1/565* (2013.01); *H03F 3/189* (2013.01); *H03H 9/46* (2013.01); *H03F 2200/171* (2013.01); *H03F 2200/387* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 2012/0223709 A1* | 9/2012 | Schillak | ............. | G01R 33/3607 324/309 |
| 2014/0176135 A1* | 6/2014 | Griswold | ........... | G01R 33/5612 324/314 |
| 2016/0105154 A1* | 4/2016 | Thomas | .................. | H03F 3/193 330/251 |

* cited by examiner

*Primary Examiner* — Douglas X Rodriguez
(74) *Attorney, Agent, or Firm* — CBM Patent Consulting, LLC

(57) ABSTRACT

A pre-amplifier for a magnetic resonance imaging radio-frequency coil. The pre-amplifier comprises an input matching circuit (1), an amplification circuit (2), an output matching circuit (3) and a narrow band filter (4) for filtering a magnetic resonance signal amplified through the amplification circuit (2). The present invention has the technical effect that the pre-amplifier for a magnetic resonance imaging radio-frequency coil generates a gain required by magnetic resonance imaging within a very small range near a magnetic resonance signal frequency point, but only generates a very small gain or has no amplification function completely at other frequency points, thereby significantly reducing the possibility of oscillation of the magnetic resonance imaging radio-frequency coil.

7 Claims, 6 Drawing Sheets

(51) Int. Cl.
*H03F 1/56* (2006.01)
*H03F 3/189* (2006.01)
*H03H 9/46* (2006.01)

Prior Art

Prior Art

US 10,338,170 B2

PRE-AMPLIFIER FOR MAGNETIC RESONANCE IMAGING RADIO-FREQUENCY COIL

This application is the U.S. national phase of International Application No. PCT/CN2015/078726 filed on 12 May 2015 which designated the U.S. and claims priority to Chinese Application Nos. CN 201410226536.5 filed on 27 May 2014, the entire contents of each of which are hereby incorporated by reference.

TECHNICAL FIELD

The invention relates to a pre-amplifier for a magnetic resonance imaging radio-frequency coil in the field of magnetic resonance imaging.

BACKGROUND OF THE INVENTION

Magnetic resonance imaging is an advanced human body non-invasive imaging technique and widely applied to diagnosis of diseases of all parts of the human body. A magnetic resonance imaging system comprises a magnetic resonance imaging radio-frequency coil, a pre-amplifier for the magnetic resonance imaging radio-frequency coil, and a magnet, a gradient and radio-frequency power amplifier, a spectrometer, a computer and other components. The structure of a magnetic resonance imaging radio-frequency coil in the prior art is an LC resonance loop. The pre-amplifier for the magnetic resonance imaging radio-frequency coil is an important constituent part of the magnetic resonance imaging system, and the performance of the pre-amplifier directly determines the magnetic resonance imaging quality. A magnetic resonance signal is detected by the magnetic resonance imaging radio-frequency coil and input into the spectrometer and the computer of the magnetic resonance imaging system through a system load $R_{load}$ to be operated after being amplified by the pre-amplifier for the magnetic resonance imaging radio-frequency coil, so that a required image is obtained.

As is shown in FIG. 1 and FIG. 2, a traditional pre-amplifier for a magnetic resonance imaging radio-frequency coil is generally structurally composed of an input matching circuit 1, an amplification circuit 2 and an output matching circuit 3 which are connected in sequence, wherein the amplification circuit 2 comprises an equivalent output impedor Zs, and the two ends of the equivalent output impedor Zs are a first output end and a second output end of the amplification circuit 2 correspondingly; the output matching circuit 3 is an LC circuit and comprises an output capacitor Cm and an output inductor Lm, and the first end of the output inductor Lm is connected with the first output end of the amplification circuit 2. The two ends of the output capacitor Cm are connected with the first output end and the second output end of the amplification circuit 2 correspondingly. The first output end and the second output end of the output matching circuit 3, namely the second end of the output inductor Lm and the second end of the output capacitor Cm, are externally connected with the two ends of the system load $R_{load}$ correspondingly. A magnetic resonance signal is amplified by the pre-amplifier for the magnetic resonance imaging radio-frequency coil and then input into the spectrometer and the computer through the system load $R_{load}$, so that the required image is obtained.

In the pre-amplifier for the magnetic resonance imaging radio-frequency coil, the output matching circuit 3 has an effect of making the impedance value of the equivalent output impedor Zs of the amplification circuit 2 matched with the impedance value of the system load $R_{load}$, so that the gain of the pre-amplifier for the magnetic resonance imaging radio-frequency coil is increased. The impedance value of the system load $R_{load}$ is generally 50 ohms; although the output matching circuit 3 can also partially have a frequency selection effect, since the impedance value of the system load $R_{load}$ is 50 ohms, the Q value of the output matching circuit 3 is extremely low, and good frequency selectivity cannot be achieved easily.

The operation bandwidth of the pre-amplifier for the magnetic resonance imaging radio-frequency coil of the structure is extremely wide, and a great gain can be achieved within the 20-40 M range near a magnetic resonance signal frequency point. FIG. 3 is a gain curve (obtained by connecting both the input end and the output end to a network analyzer for testing) for independent operation of a typical existing 3.0 T pre-amplifier for a magnetic resonance imaging radio-frequency coil, the gain of the typical existing pre-amplifier at the operation frequency point, namely the maximum gain point or the magnetic resonance signal frequency point of 127.7 M is 28 dB, and the gain of the pre-amplifier for the magnetic resonance imaging radio-frequency coil is kept over 20 dB all the time within the range of 107 M-154 M. Meanwhile, for solving the problem of coupling between channels of a multi-channel magnetic resonance imaging radio-frequency coil, the impedance value of an input matching circuit 1 of the pre-amplifier for the magnetic resonance imaging radio-frequency coil is generally extremely low, and thus the impedance of the magnetic resonance imaging radio-frequency coil is not matched with the impedance of the pre-amplifier for the magnetic resonance imaging radio-frequency coil. After a magnetic resonance signal detected by the magnetic resonance imaging radio-frequency coil is input into the pre-amplifier for the magnetic resonance imaging radio-frequency coil through the input matching circuit 1, a gain curve of the magnetic resonance signal after the combined action of the magnetic resonance imaging radio-frequency coil and the pre-amplifier for the magnetic resonance imaging radio-frequency coil is generally shown as FIG. 4, the gain curve is a curve with two peaks, namely a camel curve, the two peaks are called camel peaks, and gains at the two peaks are extremely high. The operation frequency point of the magnetic resonance imaging radio-frequency coil is generally near the center of the two camel peak frequency points, and the gain at the magnetic resonance signal frequency point is extremely low. Meanwhile, the pre-amplifier for the magnetic resonance imaging radio-frequency coil is generally placed in the magnetic resonance imaging radio-frequency coil, feedback is generated inevitably, and thus the operation frequency point of the pre-amplifier for the magnetic resonance imaging radio-frequency coil is extremely prone to oscillation near the two camel peak frequency points. It is an important technical challenge for those skilled in the field to make the pre-amplifier for the magnetic resonance imaging radio-frequency coil generate a gain required for magnetic resonance imaging only near the magnetic resonance signal frequency point and not generate oscillation at other frequency points.

BRIEF SUMMARY OF THE INVENTION

The invention aims to overcome the defects of the prior art and provides a pre-amplifier for a magnetic resonance imaging radio-frequency coil, and the pre-amplifier for the magnetic resonance imaging radio-frequency coil generates a gain required for magnetic resonance imaging only near a magnetic resonance signal frequency point, but generates an extremely small gain at other frequency points or has no amplification function at all, and therefore the probability of oscillation of the pre-amplifier for the magnetic resonance imaging radio-frequency coil is significantly reduced.

According to one technical scheme for achieving the purposes, a pre-amplifier for a magnetic resonance imaging radio-frequency coil comprises an input matching circuit, an amplification circuit, an output matching circuit and a narrow band filter used for filtering a magnetic resonance signal amplified by the amplification circuit.

Furthermore, the narrow band filter is an LC filter, and the LC filter and the output matching circuit form an integrated circuit.

Furthermore, the integrated circuit comprises an output capacitor Cm, an output inductor Lm, a first filter resistor Rm and a second filter resistor r, the first end and the second end of the output capacitor Cm are connected with the first output end and the second output end of the amplification circuit correspondingly, the first end of the output inductor Lm is connected with the first output end of the amplification circuit, the two ends of the second filter resistor r are connected with the second end of the output capacitor Cm and the second end of the output inductor Lm correspondingly, and the first filter resistor Rm is connected with the second end of the output inductor Lm.

Furthermore, the narrow band filter is a surface acoustic wave filter.

Furthermore, the output matching circuit comprises an output capacitor Cm and an output inductor Lm, the first end and the second end of the output capacitor Cm are connected with the first output end and the second output end of the amplification circuit correspondingly, the first end of the output inductor Lm is connected with the first output end of the amplification circuit, and the second end of the output inductor Lm is connected with the surface acoustic wave filter.

Furthermore, the surface acoustic wave filter is a non-magnetic surface acoustic wave.

According to another technical scheme for achieving the purpose, the pre-amplifier for the magnetic resonance imaging radio-frequency coil comprises an input matching circuit, a first-level amplification circuit, a second-level amplification circuit and an output matching circuit, the first-level amplification circuit is connected to the rear end of the input matching circuit, the output matching circuit is connected to the rear end of the second-level amplification circuit, and the first-level amplification circuit and the second-level amplification circuit are connected through a narrow band filter circuit.

Furthermore, the narrow band filter circuit comprises a filter capacitor Cf connected with the first output end of the first-level amplification circuit and a filter inductor Lf connected with the first input end of the second-level amplification circuit, the filter capacitor Cf is connected with the filter inductor Lf in series, and a bias inductor Lc is connected to the filter capacitor Cf in parallel.

Furthermore, the narrow band filter circuit comprises a first impedance matching circuit, an intermediate narrow band filter and a second impedance matching circuit which are connected in sequence, and the bias inductor Lc connected with the intermediate narrow band filter in parallel.

Furthermore, the first impedance matching circuit comprises a first matching inductor Lm1 and a first matching capacitor Cm1, the first end of the first matching inductor Lm1 is connected with the first output end of the first-level amplification circuit, the second end of the first matching inductor Lm1 is connected with the first end of the first matching capacitor Cm1, and the second end of the first matching capacitor Cm1 is connected with the second end of the first-level amplification circuit.

The second impedance matching circuit comprises a second matching inductor Lm2 and a second matching capacitor Cm2, the first end of the second matching inductor Lm2 is connected with the first input end of the second-level amplification circuit, the second end of the second matching inductor Lm2 is connected with the first end of the second matching capacitor Cm2, and the second end of the second matching capacitor Cm2 is connected with the second input end of the second-level amplification circuit.

The intermediate narrow band filter is a surface acoustic wave and is connected with the second end of the first matching inductor Lm1 and the second end of the second matching inductor Lm2.

According to one technical scheme of the pre-amplifier for the magnetic resonance imaging radio-frequency coil of the invention, the narrow band filter used for filtering the magnetic resonance signal amplified by the amplification circuit is additionally arranged in the pre-amplifier, comprising the input matching circuit, the amplification circuit and the output matching circuit, for the magnetic resonance imaging radio-frequency coil. The pre-amplifier for the magnetic resonance imaging radio-frequency coil has the technical effects that the pre-amplifier for the magnetic resonance imaging radio-frequency coil generates the gain required for magnetic resonance imaging near the magnetic resonance signal frequency point and generates an extremely small gain or has no amplification function at other frequency points, and the pre-amplifier for the magnetic resonance imaging radio-frequency coil is not prone to oscillation.

According to another technical scheme of the pre-amplifier for the magnetic resonance imaging radio-frequency coil of the invention, the narrow band filter circuit connected with the first-level amplification circuit and the second-level amplification circuit is additionally arranged in the pre-amplifier, comprising the input matching circuit, the first-level amplification circuit, the second-level amplification circuit and the output matching circuit, for the magnetic resonance imaging radio-frequency coil. The pre-amplifier for the magnetic resonance imaging radio-frequency coil has the technical effects that the pre-amplifier for the magnetic resonance imaging radio-frequency coil generates the gain required for magnetic resonance imaging near the magnetic resonance signal frequency point and generates an extremely small gain or has no amplification function at other frequency points, and the pre-amplifier for the magnetic resonance imaging radio-frequency coil is not prone to oscillation.

DETAILED DESCRIPTION OF THE INVENTION

Figure 1:
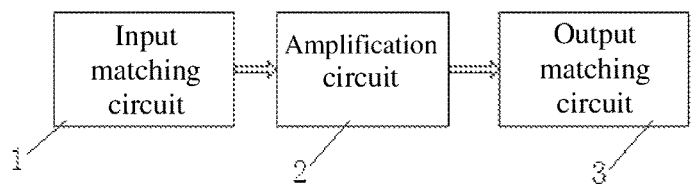
FIG. 1 is a structure diagram of an existing pre-amplifier for a magnetic resonance imaging radio-frequency coil.
Figure 2:
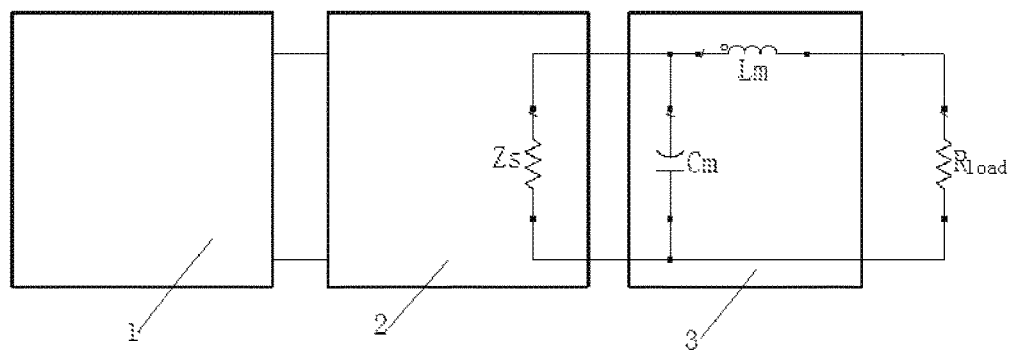
FIG. 2 is a simple circuit diagram of the existing pre-amplifier for the magnetic resonance imaging radio-frequency coil.

Please see FIG. 5-14, for a better understanding of the technical schemes of the invention, a detailed description is given by the inventor with specific embodiments and accompanying drawings as follows:
First Embodiment Please see FIG. 5, a pre-amplifier for a magnetic resonance imaging radio-frequency coil of the invention comprises an input matching circuit 1, an amplification circuit 2, an output matching circuit 3 and a narrow band filter 4 which are connected in sequence. A magnetic resonance signal is detected by the magnetic resonance imaging radio-frequency coil, input into the pre-amplifier for the magnetic resonance imaging radio-frequency coil of the invention through the input matching circuit 1 and input into a spectrometer and a computer after being subjected to impedance matching of the input matching circuit 1, amplification of the amplification circuit 2, secondary impedance matching of the output matching circuit 3 and filtering of the narrow band filter 4, so that a required image is generated. The input matching circuit 1, the amplification circuit 2 and the output matching circuit 3 are not improved in any form by the pre-amplifier for the magnetic resonance imaging radio-frequency coil of the invention.

By the adoption of the design, the pre-amplifier for the magnetic resonance imaging radio-frequency coil has an amplification function only within an extremely narrow frequency range near a magnetic resonance signal frequency point, namely the pre-amplifier for the magnetic resonance imaging radio-frequency coil generates a gain required for magnetic resonance imaging for the magnetic resonance signal only in an extremely small bandwidth near the magnetic resonance signal frequency point and generates an extremely small gain or has no amplification function at all at other frequency points. Meanwhile, the stability of the operation frequency point of the pre-amplifier for the magnetic resonance imaging radio-frequency coil is significantly improved, and the probability of oscillation of the pre-amplifier for the magnetic resonance imaging radio-frequency coil can be greatly reduced.

By connecting the narrow band filer 4 to the rear end of the output matching circuit 3, the influence of noise introduced by the narrow band filter 4 on the signal-to-noise ratio of the magnetic resonance imaging radio-frequency coil is reduced.

Meanwhile, for achieving output matching and narrow band filtering functions, the narrow band filter 4 and the output matching circuit 3 can also be made into an integrated circuit 5.

According to the pre-amplifier for the magnetic resonance imaging radio-frequency coil of the invention, by additionally arranging the narrow band filter 4 at the rear end of the output matching circuit 3, a traditional pre-amplifier for the magnetic resonance imaging radio-frequency coil with the operation bandwidth reaching tens of MHz is improved into a narrow band amplifier with an operation bandwidth of less than 10 MHz, and the narrow band amplifier has an amplification function only within an extremely small range near the magnetic resonance signal frequency point, so that the probability of oscillation of the pre-amplifier for the magnetic resonance imaging radio-frequency coil is greatly reduced under the condition that normal work of the magnetic resonance imaging radio-frequency coil is not affected.

In addition, the pre-amplifier of the invention is simple in structure and convenient to achieve.
Second Embodiment Please see FIG. 6, the pre-amplifier for the magnetic resonance imaging radio-frequency coil of the invention comprises an input matching circuit 1, an amplification circuit 2, an output matching circuit 3 and a narrow band filter 4 which are connected in sequence, wherein the input matching circuit 1 and the amplification circuit 2 are both in existence, and the output matching circuit 3 and the narrow band filter 4 form an integrated circuit 5. The input matching circuit 1 is provided with a first output end and a second output end. The amplification circuit 2 comprises a first input end, a second input end, a first output end and a second output end. The first input end and the second input end of the amplification circuit 2 are connected with the first output end and the second output end of the input matching circuit 1 correspondingly. The amplification circuit 2 comprises an equivalent output impedor Zs, and the two ends of the equivalent output impedor Zs form the first output end and the second output end of the amplification circuit 2 correspondingly. The integrated circuit 5 comprises an output capacitor Cm, an output inductor Lm, a first filter resistor Rm and a second filter resistor r, the first end and the second end of the output capacitor Cm are connected with the first output end and the second output end of the amplification circuit 2 correspondingly, the first end of the output inductor Lm is connected with the first output end of the amplification circuit 2, the two ends of the second filter resistor r are connected with the second end of the output capacitor Cm and the second end of the output inductor Lm correspondingly, and the first end of the first filter resistor Rm is connected with the second end of the output inductor Lm. The second filter resistor r is additionally arranged for increasing the Q value of the integrated circuit 5.

One end of an external system load $R_{load}$ is connected with the second end of the first filter resistor Rm, and the other end of the external system load $R_{load}$ is connected with the second end of the second filter resistor r. Since the impedance value of the system load $R_{load}$ is generally 50 ohms, the maximum impedance value of the second filter resistor r is 10 ohms, namely one fifth of the impedance value of the load $R_{load}$, and the impedance value of the first filter resistor Rm is larger than the impedance value of the second filter resistor r. The integrated circuit 5 can be further improved in that the sum of the impedance value of the first filter resistor Rm and the impedance value of the second filter resistor r is equal to the impedance value of the system load $R_{load}$, so that impedance matching with the system load $R_{load}$ is achieved.

Figure 3:
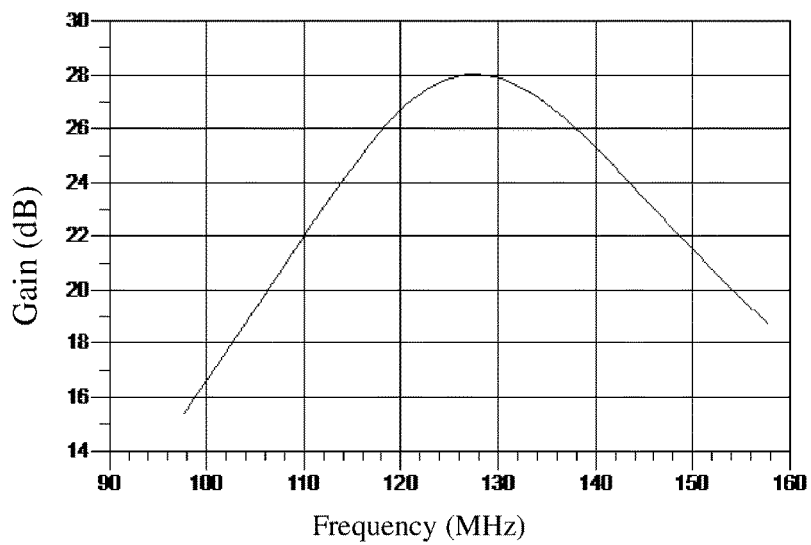
FIG. 3 is a gain curve graph for independent operation of the existing pre-amplifier for the magnetic resonance imaging radio-frequency coil.
Figure 4:
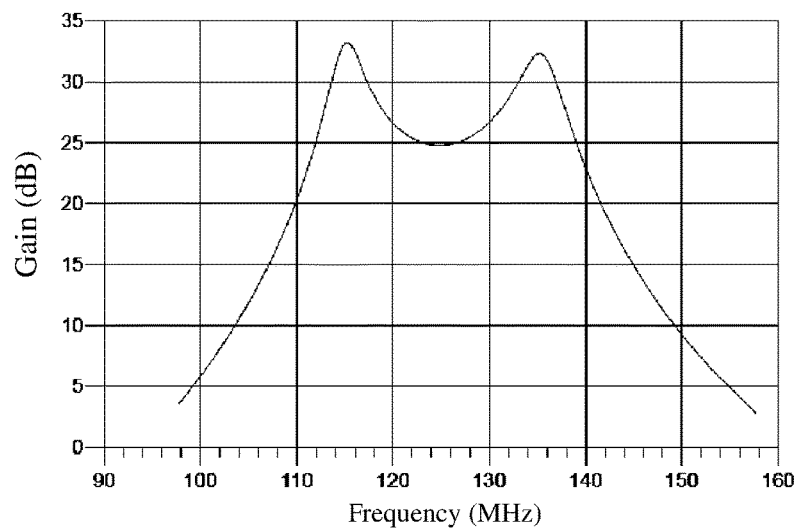
FIG. 4 is a gain curve graph of a magnetic resonance signal after the combined action of the existing pre-amplifier
Figure 5:
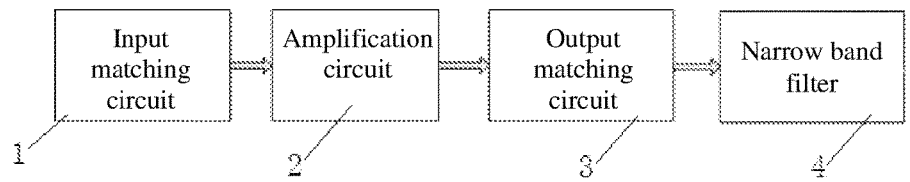
FIG. 5 is a structure diagram of a first embodiment of a pre-amplifier for a magnetic resonance imaging radio-frequency coil of the invention.
Figure 6:
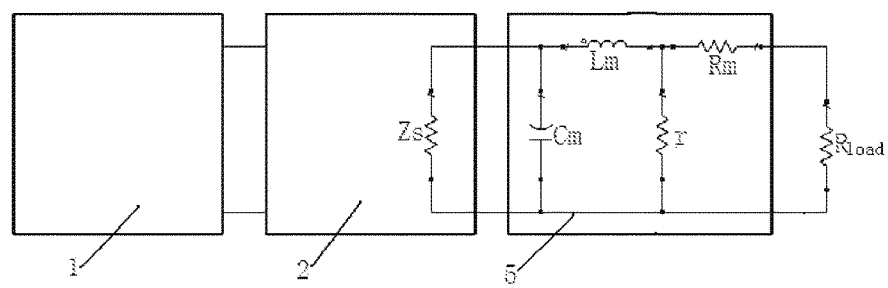
FIG. 6 is a simple circuit diagram of a second embodiment of the pre-amplifier for the magnetic resonance imaging radio-frequency coil of the invention.
Figure 7:
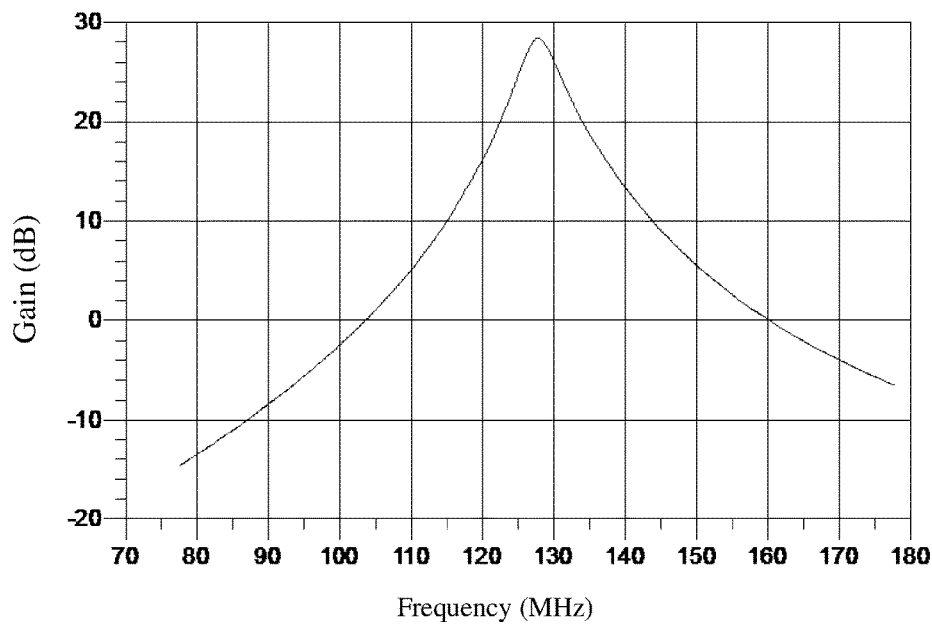
FIG. 7 is a gain curve graph for independent operation of the second embodiment of the pre-amplifier for the magnetic resonance imaging radio-frequency coil of the invention.
Figure 8:
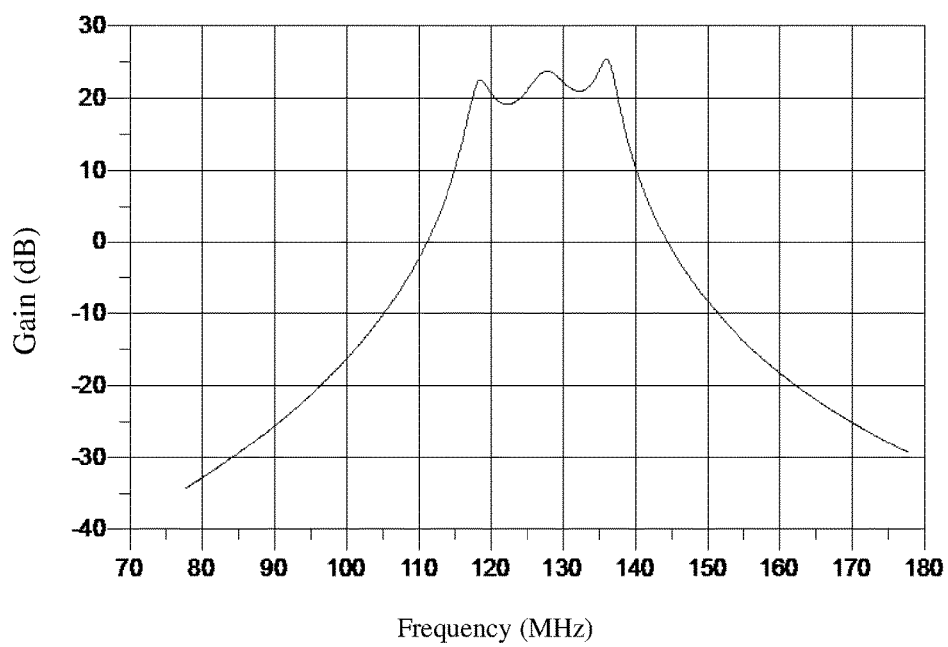
FIG. 8 is a gain curve graph of the magnetic resonance signal after the combined action of the second embodiment of the pre-amplifier for the magnetic resonance imaging radio-frequency coil of the invention and the magnetic resonance imaging radio-frequency coil.

By the adoption of the design, the Q value of the integrated circuit 5 can be greatly increased, the operation bandwidth of the pre-amplifier for the magnetic resonance imaging radio-frequency coil, namely the frequency range with the gain being larger than 20 dB, is greatly reduced accordingly, and the integrated circuit 5 has a narrow band filtering effect. FIG. 7 is the gain curve graph for independent operation of the pre-amplifier for the magnetic resonance imaging radio-frequency coil under the 3.0 T condition when the impedance value of the second filter resistor r is 3 ohms, the capacity of the output capacitor Cm is 27 pF, the inductance value of the output inductor Lm is 58 nH, and the impedance value of the first filter resistor Rm is 47 ohms. Compared with the traditional pre-amplifier for the magnetic resonance imaging radio-frequency coil shown in FIG. 3, the gain of the pre-amplifier for the magnetic resonance imaging radio-frequency coil at the frequency of 127.7 MHz is not changed, however, the frequency range with the gain being larger than 20 dB of the pre-amplifier for the magnetic resonance imaging radio-frequency coil is reduced to 11 MHz (123 MHz-134 MHz) from 47 MHz (107 Hz-154 MHz). FIG. 8 is the gain curve graph of the magnetic resonance signal after the combined action of the pre-amplifier for the magnetic resonance imaging radio-frequency coil and the magnetic resonance imaging radio-frequency coil. It can be seen from FIG. 8 that the gains of the frequency points at the two camel peaks of the camel curve are greatly reduced, the grain required for magnetic resonance imaging is still generated at the magnetic resonance signal frequency point, and the probability of oscillation of the operation frequency point of the pre-amplifier for the magnetic resonance imaging radio-frequency coil is also greatly reduced.

Third Embodiment

Figure 9:
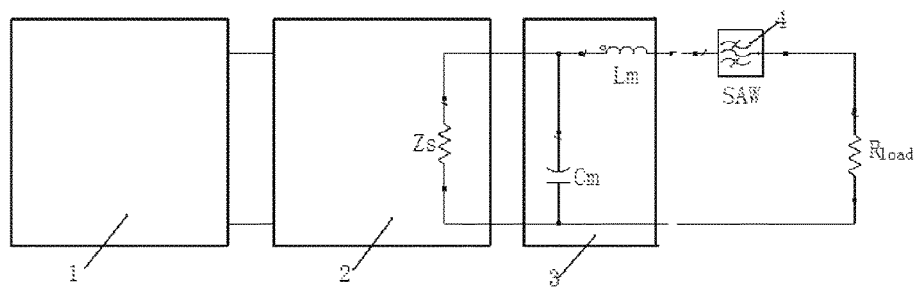
FIG. 9 is a simple circuit graph of a third embodiment of the pre-amplifier for the magnetic resonance imaging radio-frequency coil of the invention

Please see FIG. 9, the pre-amplifier for the magnetic resonance imaging radio-frequency coil of the invention comprises an input matching circuit 1, an amplification circuit 2, an output matching circuit 3 and a narrow band filter 4 which are connected in sequence. The input matching circuit 1, the amplification circuit 2 and the output matching circuit 3 are all in existence. The input matching circuit 1 is provided with a first output end and a second output end. The amplification circuit 2 comprises a first input end, a second input end, a first output end and a second output end. The first input end and the second input end of the amplification circuit 2 are connected with the first output end and the second output end of the input matching circuit 1 correspondingly. The amplification circuit 2 comprises an equivalent output impedor Zs, and the two ends of the equivalent output impedor Zs form the first output end and the second output end of the amplification circuit 2 correspondingly. The output matching circuit 3 is an LC circuit and comprises an output capacitor Cm and an output inductor Lm, wherein the first end and the second end of the output capacitor Cm are connected with the first output end and the second output end of the amplification circuit 2 correspondingly, and the first end of the output inductor Lm is connected with the first output end of the amplification circuit 2.

In the embodiment, a surface acoustic wave filter (SAW filter) is adopted to serve as the narrow band filter 4, and the internal impedance of the surface acoustic wave filter has already been matched to 50 ohms. The input end of the surface acoustic wave filter is connected with the second end of the output inductor Lm. One end of the external system load $R_{load}$ is connected with the output end of the surface acoustic wave filter, and the other end of the external system load $R_{load}$ is connected with the second end of the output capacitor Cm.

By the adoption of the surface acoustic wave filter, the surface acoustic wave filter can have the insertion loss of several dB near the magnetic resonance signal frequency point and rapidly has the insertion loss of tens of dB or even more beyond about 3-4 MHz near the magnetic resonance signal frequency point, and a band-pass characteristic curve is extremely steep; in addition, the consistency is good, debugging is not needed, and the anti-jamming capability is high.

Figure 10:
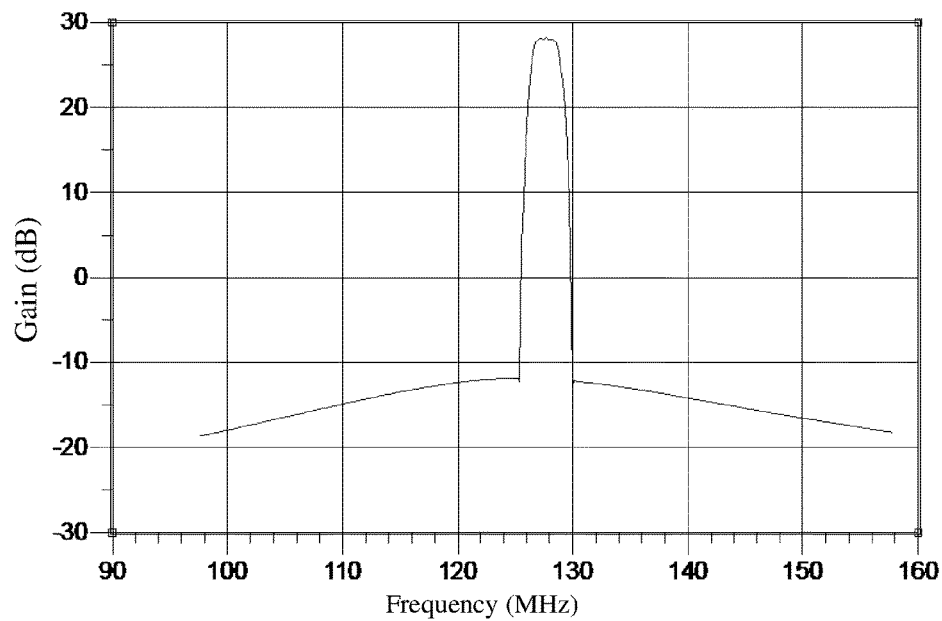
FIG. 10 is a gain curve graph for independent operation of the third embodiment of the pre-amplifier for the magnetic resonance imaging radio-frequency coil of the invention.
Figure 11:
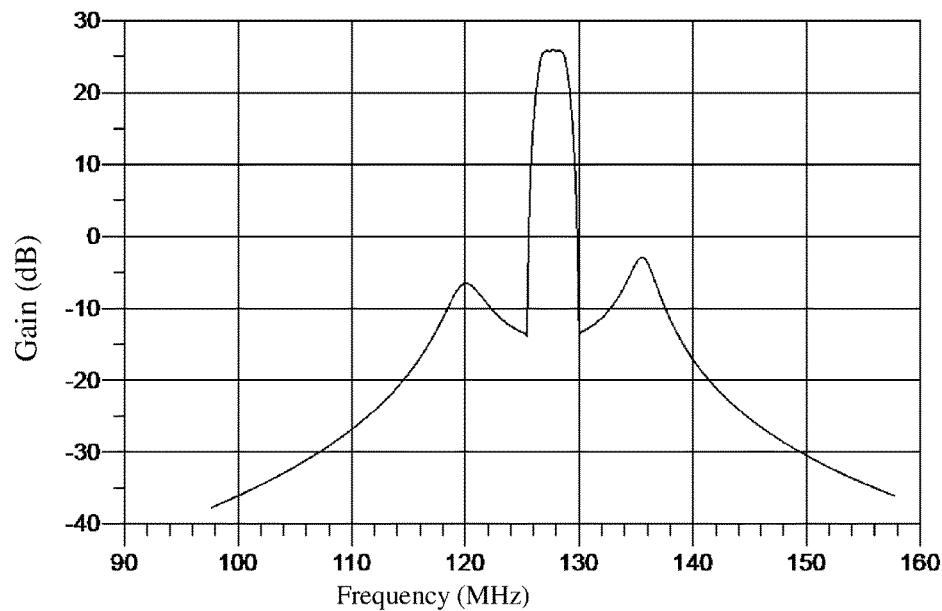
FIG. 11 is a gain curve graph of the magnetic resonance signal after the combined action of the third embodiment of the pre-amplifier for the magnetic resonance imaging radio-frequency coil of the invention and the magnetic resonance imaging radio-frequency coil.

In the embodiment, the gain curve graph for independent operation of the pre-amplifier for the magnetic resonance imaging radio-frequency coil is shown in FIG. 10. It can be seen that the pre-amplifier for the magnetic resonance imaging radio-frequency coil has the gain of 28 dB within the 2 MHz range near the frequency of 127.7 MHz, and gains at other frequency points are all extremely low. The gain curve graph of the magnetic resonance signal after the combined action of the pre-amplifier for the magnetic resonance imaging radio-frequency coil and the magnetic resonance imaging radio-frequency coil is shown in FIG. 11. It can be seen from FIG. 11 that although the two camel peaks of the gain curve still exist, the heights of the camel peaks is already smaller than 0 dB, and oscillation of the pre-amplifier for the magnetic resonance imaging radio-frequency coil is avoided.

However, since a general surface acoustic wave filter has an influence on magnetic resonance imaging, a non-magnetic or weak-magnetic surface acoustic wave filter is needed.

Fourth Embodiment

Figure 12:
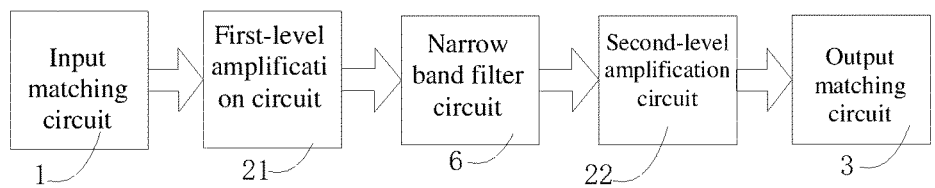
FIG. 12 is a structure diagram of a fourth embodiment of the pre-amplifier for the magnetic resonance imaging radio-frequency coil of the invention.

Please see FIG. 12, the embodiment is the improvement of the first embodiment, and the pre-amplifier for the magnetic resonance imaging radio-frequency coil of the invention comprises an input matching circuit 1, a first-level amplification circuit 21, a narrow band filter circuit 6, a second-level amplification circuit 22 and an output matching circuit 3 which are connected in sequence.

A magnetic resonance signal is detected by the magnetic resonance imaging radio-frequency coil, input into the pre-amplifier for the magnetic resonance imaging radio-frequency coil of the invention through the input matching circuit 1 and input into the spectrometer and the computer after being subjected to impedance matching of the input matching circuit 1, primary amplification of the first-level amplification circuit 21, filtering of the narrow band filter circuit 6, secondary amplification of the second-level amplification circuit 22 and secondary impedance matching of the output matching circuit 3, so that the required image is obtained. The input matching circuit 1, the amplification circuit 2 and the output matching circuit 3 are not changed in any form by the pre-amplifier of the magnetic resonance imaging radio-frequency coil of the invention. The structure of the first-level amplification circuit 21 and the structure of the second amplification circuit 22 are completely the same.

In the embodiment, based on the achievement of the technical effects of the first embodiment, the magnetic resonance signal is further amplified, the gain of the pre-amplifier for the magnetic resonance imaging radio-frequency coil to the magnetic resonance signal is further increased, and the internal feedback from the output end to the input end of the pre-amplifier for the magnetic resonance imaging radio-frequency coil is reduced.

By connecting the narrow band filter circuit 6 between the first-level amplification circuit 21 and the second amplification circuit 22, the purpose of reducing the influence of noise introduced by the narrow band filter circuit 6 on the signal-to-noise ratio of the magnetic resonance imaging radio-frequency coil is realized.

Fifth Embodiment

Figure 13:
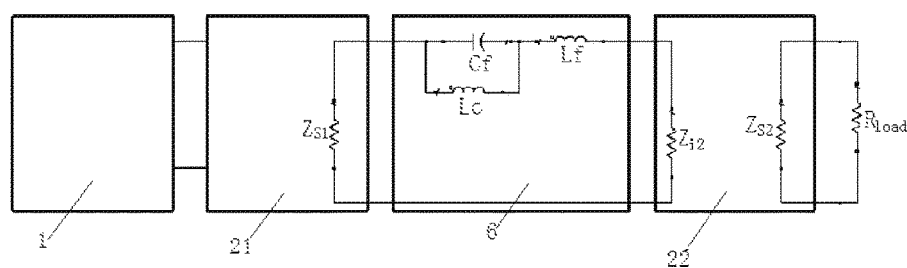
FIG. 13 is a simple circuit diagram of a fifth embodiment of the pre-amplifier for the magnetic resonance imaging radio-frequency coil of the invention.

Please see FIG. 13, the fifth embodiment is a further improvement of the second embodiment.

The pre-amplifier for the magnetic resonance imaging radio-frequency coil of the invention comprises an input matching circuit 1, a first-level amplification circuit 21, a narrow band filter circuit 6, a second-level amplification circuit 22 and an output matching circuit 3 which are connected in sequence. The input matching circuit 1, the first-level amplification circuit 21, the second-level amplification circuit 22 and the output matching circuit 3 are all in existence. The structures of the first-level amplification circuit 21 and the second-level amplification circuit 22 are also completely the same as the structure of the amplification circuit 2 in the second embodiment and the third embodiment.

The input matching circuit 1 is provided with a first output end and a second output end. The first-level amplification circuit 21 comprises a first input end, a second input end, a first output end and a second output end. The first input end and the second input end of the first-level amplification circuit 21 are connected with the first output end and the second output end of the input matching circuit 1 correspondingly. The first-level amplification circuit 21 further comprises an equivalent first-level output impedor $Zs1$, and the two ends of the equivalent first-level output impedor $Zs1$ form the first output end and the second output end of the first-level amplification circuit 21 correspondingly.

The second-level amplification circuit 22 comprises a first input end, a second input end, a first output end and a second output end. The second-level amplification circuit 22 further comprises an equivalent second-level input impedor $Zi2$ and an equivalent second-level output impedor $Zs2$, and the two ends of the equivalent second-level input impedor $Zi2$ form the first input end and the second input end of the second-level amplification circuit 22 correspondingly. The two ends of the equivalent second-level output impedor $Zs2$ form the first output end and the second output end of the second-level amplification circuit 22 correspondingly.

The narrow band filter circuit 6 comprises a filter capacitor $Cf$ connected with the first output end of the first-level amplification circuit 21 and a filter inductor $Lf$ connected with the first input end of the second-level amplification circuit 22, the filter capacitor $Cf$ is connected with the filter inductor $Lf$ in series, and a bias inductor $Lc$ is connected to the filter capacitor $Cf$ in parallel.

The output matching circuit 3 is not shown in FIG. 13, the structure of the output matching circuit 3 is the same as the structure of the output matching circuit 3 in the third embodiment, and the connection method of the output matching circuit 3 and the second-level amplification circuit 22 is the same as the connection method of the output matching circuit 3 and the amplification circuit 2 in the third embodiment. The connection method of the output matching circuit 3 and the system load $R_{load}$ is the same as the connection method in the third embodiment.

In the embodiment, based on the achievement of the technical effects of the second embodiment, the magnetic resonance signal is further amplified, the gain of the pre-amplifier for the magnetic resonance imaging radio-frequency coil to the magnetic resonance signal is further increased, and the internal feedback from the output end to the input end of the pre-amplifier for the magnetic resonance imaging radio-frequency coil is reduced.

By arranging the bias inductor $Lc$ in the embodiment, a cascode structure is formed between the first-level amplification circuit 21 and the second-level amplification circuit 22, and the bias inductor $Lc$ is a high-impedance inductor and can make a direct-current loop of the first-level amplification circuit 21 communicate with a direct-current loop of the second-level amplification circuit 22.

Sixth Embodiment

Figure 14:
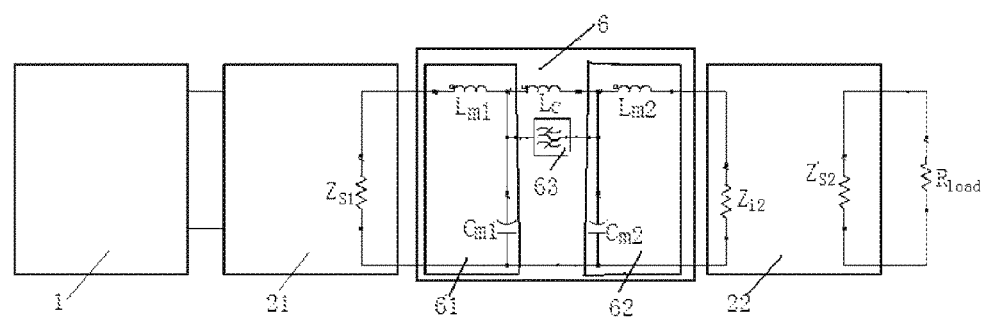
FIG. 14 is a simple circuit diagram of a sixth embodiment of the pre-amplifier for the magnetic resonance imaging radio-frequency coil of the invention.

Please see FIG. 14, the sixth embodiment is the further improvement of the third embodiment.

The pre-amplifier for the magnetic resonance imaging radio-frequency coil of the invention comprises an input matching circuit 1, a first-level amplification circuit 21, a narrow band filter circuit 6, a second-level amplification circuit 22 and an output matching circuit 3 which are connected in sequence. The input matching circuit 1, the first-level amplification circuit 21, the second-level amplification circuit 22 and the output matching circuit 3 are all in existence. The structures of the first-level amplification circuit 21 and the second-level amplification circuit 22 are also completely the same as the structure of the amplification circuit 2 in the second embodiment and the third embodiment.

The input matching circuit 1 is provided with a first output end and a second output end. The first-level amplification circuit 21 comprises a first input end, a second input end, a first output end and a second output end. The first input end and the second input end of the first-level amplification circuit 21 are connected with the first output end and the second output end of the input matching circuit 1 correspondingly. The first-level amplification circuit 21 further comprises an equivalent first-level output impedor $Zs1$, and the two ends of the equivalent first-level output impedor $Zs1$ form the first output end and the second output end of the first-level amplification circuit 21 correspondingly.

The second-level amplification circuit 22 comprises a first input end, a second input end, a first output end and a second output end. The second-level amplification circuit 22 further comprises an equivalent second-level input impedor $Zi2$ and an equivalent second-level output impedor $Zs2$, and the two ends of the equivalent second-level input impedor $Zi2$ form the first input end and the second input end of the second-level amplification circuit 22 correspondingly. The two ends of the equivalent second-level output impedor $Zs2$ form the first output end and the second output end of the second-level amplification circuit 22 correspondingly.

The output matching circuit 3 is not shown in FIG. 14, the structure of the output matching circuit 3 is the same as the structure of the output matching circuit 3 in the third embodiment, and the connection method of the output matching circuit 3 and the second-level amplification circuit 22 is the same as the connection method of the output matching circuit 3 and the amplification circuit 2 in the third embodiment. The connection method of the output matching circuit 3 and the system load $R_{load}$ is the same as the connection method in the third embodiment.

The narrow band filter circuit 6 comprises a first impedance matching circuit 61, an intermediate narrow band filter 63 and a second impedance matching circuit 62 which are connected in sequence, and a bias inductor Lc connected with the intermediate narrow band filter 63 in parallel.

The first impedance matching circuit 61 comprises a first matching inductor Lm1 and a first matching capacitor Cm1, the first end of the first matching inductor Lm1 is connected with the first output end of the first-level amplification circuit 21, the second end of the first matching inductor Lm1 is connected with the first end of the first matching capacitor Cm1, and the second end of the first matching capacitor Cm1 is connected with the second output end of the first-level amplification circuit 21.

The second impedance circuit 62 comprises a second matching inductor Lm2 and a second matching capacitor Cm2, the first end of the second matching inductor Lm2 is connected with the first input end of the second-level amplification circuit 22, the second end of the second matching inductor Lm2 is connected with the first end of the second matching capacitor Cm2, and the second end of the second matching capacitor Cm2 is connected with the second input end of the second-level amplification circuit 22.

The intermediate narrow band filter 63 is a surface acoustic wave filter, the internal impedance of the surface acoustic wave filter has already been matched to 50 ohms, and the second end of the first matching inductor Lm1 and the second end of the second matching inductor Lm2 are connected through the surface acoustic wave filter. Meanwhile, the second end of the first matching capacitor Cm1 and the second end of the second matching capacitor Cm2 are also connected.

By arranging the bias inductor Lc in the embodiment, a cascode structure is formed between the first-level amplification circuit 21 and the second-level amplification circuit 22, and the bias inductor Lc is a high-impedance inductor and can make a direct-current loop of the first-level amplification circuit 21 communicate with a direct-current loop of the second-level amplification circuit 22.

In the embodiment, based on the achievement of the technical effects of the third embodiment, the magnetic resonance signal is further amplified, the gain of the pre-amplifier for the magnetic resonance imaging radio-frequency coil to the magnetic resonance signal is further increased, and the internal feedback from the output end to the input end of the pre-amplifier for the magnetic resonance imaging radio-frequency coil is reduced.

Those skilled in the field should realize that the above embodiments are only used for describing the invention, the invention is not limited to the above embodiments, and all changes and transformations of the above embodiment in the essence of the invention are included in the scope of the claims of the invention.

What is claimed is:

1. A pre-amplifier for a magnetic resonance imaging radio-frequency coil, comprising an input matching circuit, an amplification circuit, an output matching circuit and a narrow band filter for filtering a magnetic resonance signal amplified by the amplification circuit;

wherein the narrow band filter is an LC filter, and the LC filter and the output matching circuit form an integrated circuit; wherein the integrated circuit comprises an output capacitor Cm, an output inductor Lm, a first filter resistor Rm and a second filter resistor r, the first end and the second end of the output capacitor Cm are connected with the first output end and the second output end of the amplification circuit respectively the first end of the output inductor Lm is connected with the first output end of the amplification circuit, the two ends of the second filter resistor r are connected with the second end of the output capacitor Cm and the second end of the output inductor Lm respectively, and the first end of the first filter resistor Rm is connected with the second end of the output inductor Lm.

2. The pre-amplifier for the magnetic resonance imaging radio-frequency coil according to claim 1, wherein the narrow band filter is a surface acoustic wave filter.

3. The pre-amplifier for the magnetic resonance imaging radio-frequency coil according to claim 2, wherein the second end of the output inductor Lm is connected with the surface acoustic wave filter.

4. The pre-amplifier for the magnetic resonance imaging radio-frequency coil according to claim 3, wherein the surface acoustic wave filter is a non-magnetic surface acoustic wave filter.

5. A pre-amplifier for a magnetic resonance imaging radio-frequency coil, comprising an input matching circuit, a first-level amplification circuit, a second-level amplification circuit and an output matching circuit, wherein the first-level amplification circuit (21) is connected to the input matching circuit (1), and the output matching circuit (3) is connected to the second-level amplification circuit (22); wherein a narrow band filter circuit is disposed between the first-level amplification circuit and the second-level amplification circuit; the narrow band filter circuit comprising a filter capacitor Cf connected with the first output end of the first-level amplification circuit and a filter inductor Lf connected with the first input end of the second-level amplification circuit, the filter capacitor Cf is connected with the filter inductor Lf in series, and a bias inductor Lc is connected to the filter capacitor Cf in parallel.

6. The pre-amplifier for the magnetic resonance imaging radio-frequency coil according to claim 5, wherein the narrow band filter circuit comprises a first impedance matching circuit, an intermediate narrow band filter and a second impedance matching circuit which are connected in sequence, and the bias inductor Lc is connected with the intermediate narrow band filter in parallel.

7. The pre-amplifier for the magnetic resonance imaging radio-frequency coil according to claim 6, wherein the first impedance matching circuit comprises a first matching inductor Lm1 and a first matching capacitor Cm1, the first end of the first matching inductor Lm1 is connected with the first output end of the first-level amplification circuit, the second end of the first matching inductor Lm1 is connected with the first end of the first matching capacitor Cm1, and the second end of the first matching capacitor Cm1 is connected with the second end of the first-level amplification circuit;

the second impedance matching circuit comprises a second matching inductor Lm2 and a second matching capacitor Cm2, the first end of the second matching inductor Lm2 is connected with the first input end of the second-level amplification circuit, the second end of the second matching inductor Lm2 is connected with the first end of the second matching capacitor Cm2, and the second end of the second matching capacitor Cm2 is connected with the second input end of the second-level amplification circuit;
wherein is a surface acoustic wave and is connected with the second end of the first matching inductor Lm1 and the second end of the second matching inductor Lm2.

* * * * *

UNITED STATES PATENT AND TRADEMARK OFFICE
CERTIFICATE OF CORRECTION

PATENT NO. : 10,338,170 B2
APPLICATION NO. : 15/313110
DATED : July 2, 2019
INVENTOR(S) : Zhang et al.

Page 1 of 1

It is certified that error appears in the above-identified patent and that said Letters Patent is hereby corrected as shown below:

On the Title Page

Item (73), should read as follows:
(73) Assignee: SHANGHAI CHENGUANG MEDICAL TECHNOLOGIES CO., LTD, Shanghai (CN)

Signed and Sealed this
Twentieth Day of August, 2019

Andrei Iancu
*Director of the United States Patent and Trademark Office*